United States Patent [19]

Fukuzawa et al.

[11] Patent Number: 5,162,087
[45] Date of Patent: Nov. 10, 1992

[54] ANISOTROPIC CONDUCTIVE ADHESIVE COMPOSITIONS

[75] Inventors: Hidemoto Fukuzawa, Koganei; Tatsuhiro Imai, Sayama; Yasuhiro Okada, Iruma; Noriyuki Ousaka, Sayama, all of Japan

[73] Assignees: Soken Chemical & Engineering Co., Ltd.; Chemitech Corporation, both of Tokyo, Japan

[21] Appl. No.: 753,198

[22] Filed: Aug. 30, 1991

[30] Foreign Application Priority Data

Sep. 3, 1990 [JP] Japan .................. 2-232671

[51] Int. Cl.$^5$ ............ H01R 11/01; G09F 9/00; H01B 5/16
[52] U.S. Cl. .................. 252/500; 252/512; 252/513; 252/514; 252/518; 524/439; 524/441; 524/440; 524/401; 524/430
[58] Field of Search ........... 252/500, 512, 513, 514, 252/518; 524/439, 441, 440, 401, 430

[56] References Cited

U.S. PATENT DOCUMENTS 3,932,311  1/1976  Caldwell .................. 252/512
5,021,487  1/1991  Klemarczuk .............. 526/230

FOREIGN PATENT DOCUMENTS 40183   2/1987  Japan .
40184   2/1987  Japan .
206772  9/1987  Japan .
237372 10/1988  Japan .

Primary Examiner—William R. Dixon, Jr.
Assistant Examiner—Melissa Bonner
Attorney, Agent, or Firm—Webb, Burden, Ziesenheim & Webb

[57] ABSTRACT

An anisotropic conductive adhesive composition comprising an insulating adhesive component and particles dispersed in said insulating adhesive component, said anisotropic conductive adhesive composition being characterized in that said insulating adhesive component comprises a copolymer of acrylic ester having an alkyl group of 1–4 carbon atoms and a maleimide derivative, 5 to 60 parts by weight, based on 100 parts by weight of the copolymer, of a thermosetting resin, and 0.05 to 5.0 parts by weight, based on 100 parts by weight of the copolymer, of a coupling agent, and said particles are metallic-layer containing particles comprising a core made of resin, a metallic layer covering said core and a resin layer formed from finely divided resin fixed by the dry blending method on the surface of said metallic layer.

7 Claims, 3 Drawing Sheets

ANISOTROPIC CONDUCTIVE ADHESIVE COMPOSITIONS

FIELD OF THE INVENTION

This invention relates to anisotropic conductive adhesive compositions for use in bonding printed circuit boards having formed circuit patterns on the surface thereof together and simultaneously in connecting electrically said printed patterns to each other.

BACKGROUND OF THE INVENTION

As adhesives for bonding printed circuit boards having formed circuit patterns on the surface thereof together in such a manner that said circuit patterns are opposite to each other, there are known, for example, sheet-like adhesives (connecting sheets) formed from adhesive compositions containing conductive particles dispersed in heat fusible and electrically insulating adhesive components (see Japanese Patent L-O-P Publns. Nos. 206772/1987, 40183/1987 and 40184/1987).

When the above-mentioned connecting sheet is interposed between circuit patterns of two pieces of printed circuit boards and the resulting assembly is pressed with heat, the insulating adhesive component of said connection sheet melts and move in the lateral direction of the circuit patterns overlapping each other and only the conductive particles are held between the circuit patterns, thus the portions of the overlapping circuit patterns having interposed the conductive particles between said portions can be connected electrically to each other and, at the same time, two pieces of the printed circuit boards can be bonded to each other by means of the insulating adhesive component of the connecting sheet.

As the conductive particles used in the connecting sheet as illustrated above, there have heretofore been used metallic particles, resin-coated metallic particles prepared by coating a metallic core material with a resin, and metal-coated resin particles having thereon a metallic layer formed by plating the surface of a resin core material with a metal.

However, when the connecting sheet containing as the conductive particles, for example, metallic particles, was used in the case as mentioned above, there was such a problem that circuit patterns contiguous to the circuit patterns to which said connecting sheet has been applied are apt to short-circuit when come in contact with said metallic particles. Further, there is also such a difficulty in manufacturing the connecting sheet containing metallic particles as the conductive particles that because of a large difference in gravity between the metallic particles and the insulating adhesive component, it is difficult to disperse said metallic particles in said insulating adhesive component. Furthermore, because such metallic particles as contained in the connecting sheet in most cases are not uniform in shape and particle diameter and also high in hardness, said metallic particles interposed between the circuit patterns will not be deformed even when a pressure is applied thereto and the contact area of said metallic particles with said circuit patterns becomes very small and, therefore, the use of the connecting sheet containing such metallic particles as mentioned above is apt to result in poor conduction of current in the connected terminal portions.

In order to solve such problems associated with the use of the metallic particles as mentioned above, there are used metallic particles having formed a resin coat layer on the surface of said metallic particles. The resin-coated metallic particles as mentioned above do not have conductibility when they are in a usual state, but the conductibility of said resin-coated metallic particles is exhibited when the resin coat layer of the resin-coated metallic particles held between the circuit patterns formed on two pieces of printed circuit boards is destroyed by the pressure applied to said printed circuit boards. Accordingly, the aforementioned problem that the contiguous circuit patterns that come in contact with the metallic particles are apt to short-circuit may be solved by the use of the connecting sheet containing such resin-coated metallic particles as mentioned above. Basically, however, the use of the metallic particles in the connecting sheet remains unchanged, and the aforementioned problem of poor conduction of current in the connected terminal portions of the circuit patterns due to nonuniformity of dispersion of the metallic particles in the insulating adhesive component and nonuniformity of particle diameter of the metallic particles still remains unsolved.

On the contrary, metal-coated resin particles having a metallic coat on a core material made of resin will have a relatively large contact surface, because they deform when pressed between the circuit patterns, hence the above-mentioned poor conduction of current in the connected terminal portions of the circuit patterns is hard to occur and, moreover, they have good dispersibility in the insulating adhesive component, because the core material of said particles is made of resin and there is no large differences in gravity between the particle and the insulating adhesive component. However, the surface of the metal-coated resin particles is composed of metal, hence the short circuit caused by contact of these metal-coated particle with the contiguous circuit patterns cannot be prevented.

As can be seen from the foregoing, it is hard to said that the conductive particles used in the conventional anisotropic conductive adhesives as mentioned previously have such characteristics sufficient for the purposes intended.

In the above-mentioned conventional anisotropic conductive adhesives, thermoplastic resins are used mainly and frequently as the insulating adhesive components in which such particles as mentioned above are to be dispersed.

The advantage that can be derived from the use of the thermoplastic resin as the insulating adhesive component in the anisotropic conductive adhesive as mentioned above is that the printed circuit boards having the circuit patterns on their surface can be bonded together as desired by heating and pressing at a relatively low temperature and for a relatively short period of time.

However, in the anisotropic conductive adhesive using the thermoplastic resin as the insulating adhesive component, the thermoplastic resin used as the insulating adhesive component has such a side that said resin cannot be said to have a sufficient stability to standing or aging, and particularly said insulating adhesive component is apt to have flowability when heat is applied thereto for a long period of time under the circumstances of high humidity. Accordingly, when the anisotropic conductive adhesive having such insulating adhesive component as above is used under the conditions as mentioned above, the conductive particles held between the circuit patterns sometimes move as the insulating adhesive component comes to flow, whereby conductibility between the circuit patterns, that is, a value of electrical resistance, becomes unstable.

In order to solve such problems as mentioned above, thermosetting resins are used also as the insulating adhesive components.

By virtue of the use of the thermosetting resins as the insulating adhesive components in the anisotropic conductive adhesive, stability to moisture and heat and reliability of said adhesive are sharply improved. The thermosetting resins, however, involve such problems that the resins are generally short in working life (time), and they require high temperature and extended period of time when used in application for bonding purposes.

OBJECT OF THE INVENTION

The present invention is intended to solve such problems associated with the prior art as mentioned above, and an object of the invention is to provide anisotropic conductive adhesive compositions containing a specific insulating adhesive component and specific conductive particles uniformly dispersed in said insulating adhesive component, by the use of which the contiguous circuit patterns will not short circuit, and poor conduction of current in the connected terminal portions of the circuit patterns is hard to occur.

SUMMARY OF THE INVENTION

The present invention provides anisotropic conductive adhesive compositions containing an insulating adhesive component and particles dispersed in said insulating adhesive component, said anisotropic conductive adhesive compositions being characterized in that said insulating adhesive component comprises a copolymer of acrylic ester having an alkyl group of 1-4 carbon atoms and a maleimide derivative, 5 to 60 parts by weight, based on 100 parts by weight of the copolymer, of a thermosetting resin, and 0.05 to 5.0 parts by weight, based on 100 parts by weight of the copolymer, of a coupling agent, and said particles are metallic-layer containing particles (metal containing particles) comprising a core made of resin, a metallic layer covering said core and a resin layer formed from finely divided resin fixed by the dry blending method on the surface of said metallic layer.

The invention also provides anisotropic conductive adhesive compositions comprising an insulating adhesive component, particles dispersed in said insulating adhesive component and inorganic particles, said anisotropic conductive adhesive compositions being characterized in that said insulating adhesive component comprises a copolymer of acrylic ester having an alkyl group of 1-4 carbon atoms and a maleimide derivative, 5 to 60 parts by weight, based on 100 parts by weight of the copolymer, of a thermosetting resin, and 0.05 to 5.0 parts by weight, based on 100 parts by weight of the copolymer, of a coupling agent, and said particles are metallic-layer containing particles (metal containing particles) comprising a core made of resin, a metallic layer covering said core and a resin layer formed from finely divided resin fixed by the dry blending method on the surface of said metallic layer, and said inorganic particles have an average particle diameter of not more than 1/10 of the average particle diameter of said metallic-layer containing particles.

When the anisotropic conductive adhesive compositions of the present invention as illustrated above are used in bonding printed circuit boards together, contiguous circuit patterns will not short circuit, because the metallic layer of the metallic-layer containing particles is coated with the resin layer and the metallic-layer containing particles will not exhibit insulation properties. And, the metallic-layer containing particles will come to exhibit conductibility when the resin layer constituting the outermost shell of said metallic-layer containing particles is destroyed at the time of contact heating and bonding two pieces of printed circuit boards together. Further, because the metallic-layer containing particles having the specific resin layer as the outermost shell are used as the conductive particles of the anisotropic conductive adhesive compositions of the present invention, said metallic-layer containing particles are dispersed uniformly in the insulating adhesive component, and such poor conduction of current as aforementioned is hard to occur.

| 7 ... Core | 9 ... Metallic layer |
| 11 ... Resin layer | 15 ... Finely divided resin |

Figure 2:
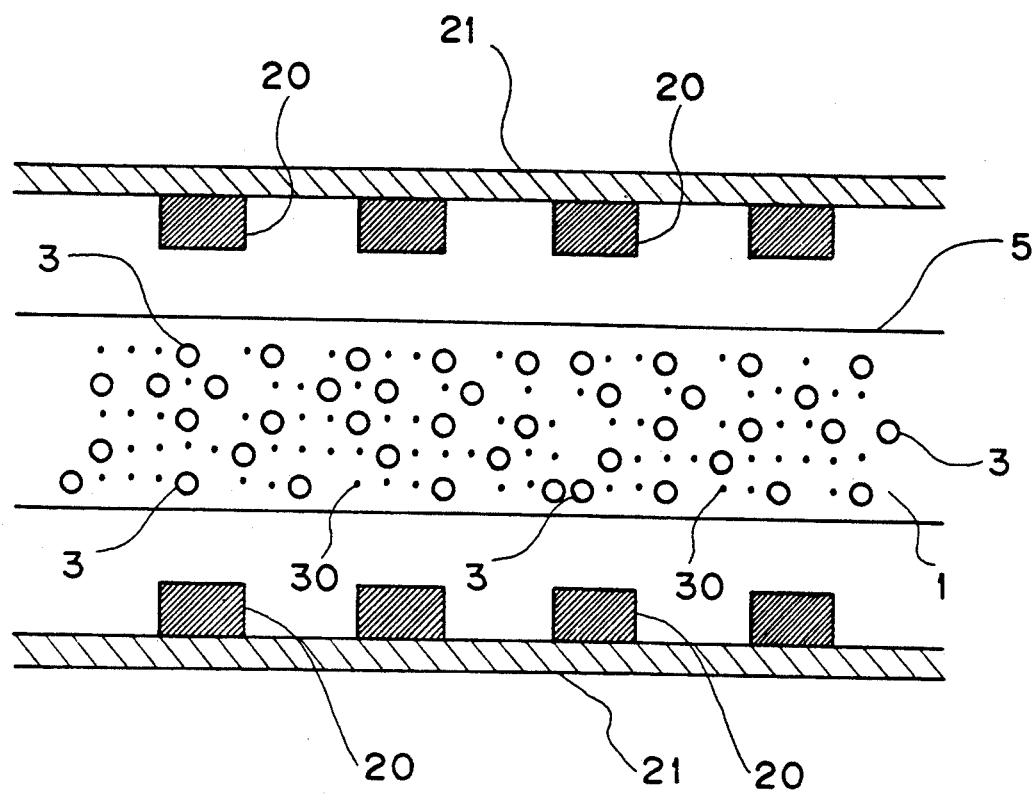
Figure 3:
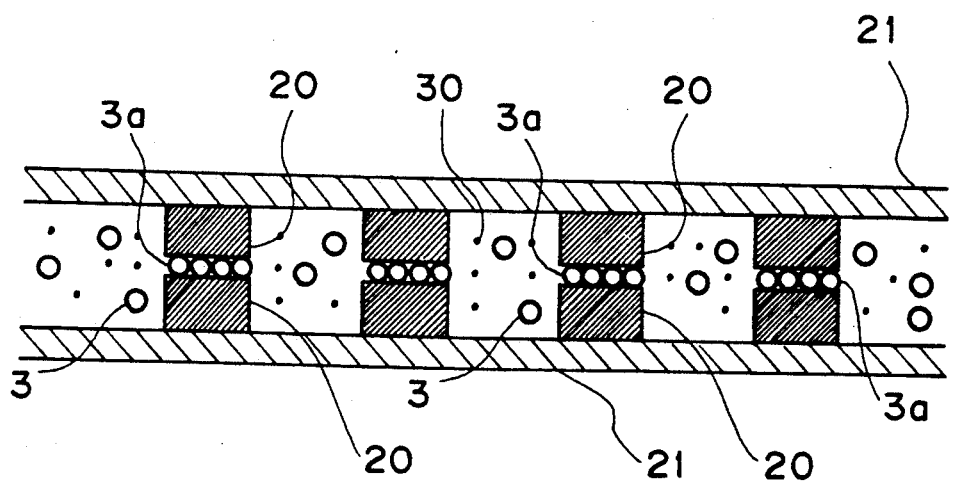

FIGS. 2 and 3 schematically illustrate the condition under which printed circuit boards are bonded together by using the anisotropic conductive adhesive composition of the present invention formulated into a sheet-like form.

| 1 ... Insulating adhesive component |
| 3 ... Metallic-layer containing particles |
| 5 ... Sheet-like anisotropic conductive adhesive composition |
| 20 ... Circuit pattern |
| 21 ... Substrate |
| 30 ... Inorganic particle |
| 3a ... Metallic-layer containing particle, the resin layer of which has been destroyed |

Figure 4:
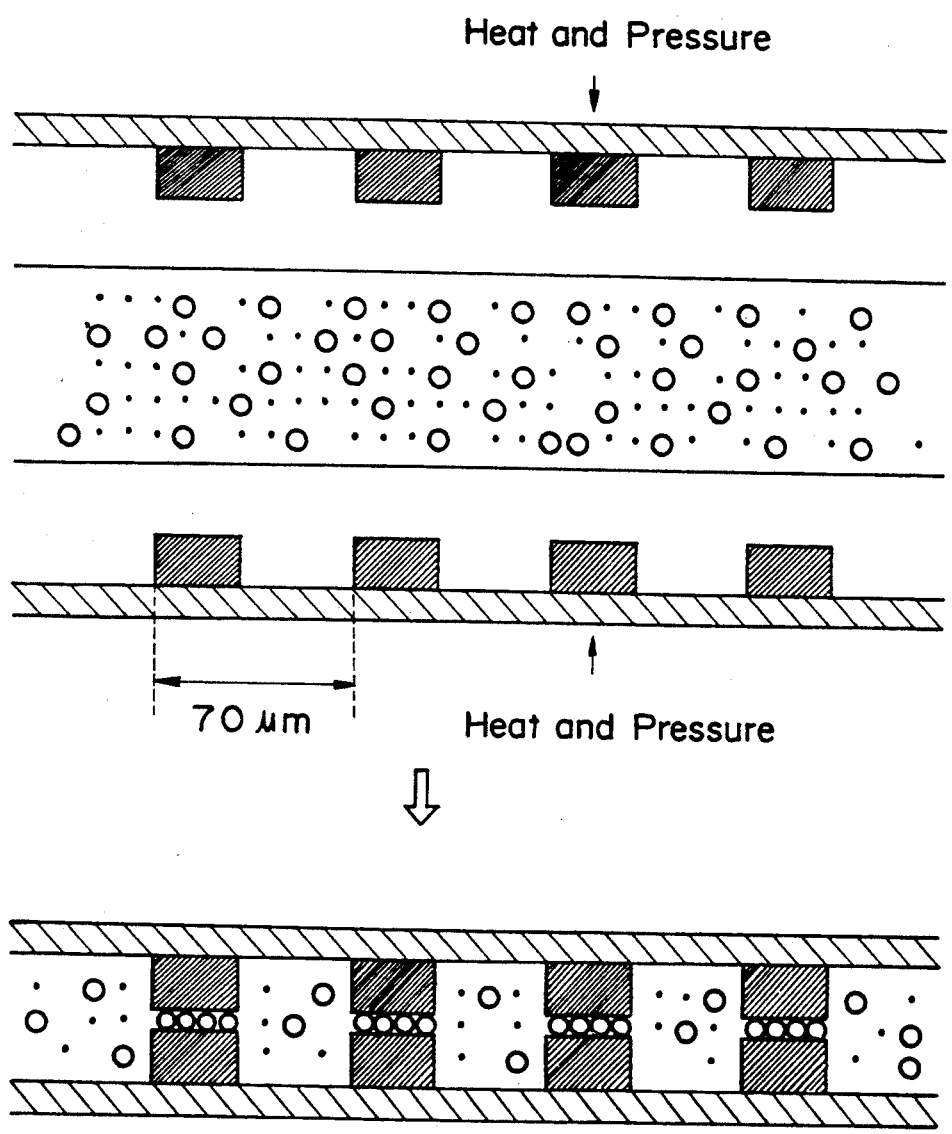

FIG. 4 is a sectional view of the sample of the bonded printed circuit board prepared in the examples and used for the measurement of conduction resistance, insulation properties and adhesivity.

DETAILED DESCRIPTION OF THE INVENTION

The anisotropic conductive adhesive compositions of the present invention are illustrated below in detail.

The insulating adhesive component which is a constituent of the anisotropic conductive adhesive composition of the invention is composed of a copolymer of acrylic ester having an alkyl group of 1-4 carbon atoms and a maleimide derivative (an insulating acrylic adhesive component), a thermosetting resin and a coupling agent.

By using such specific acrylic copolymer as mentioned above in combination with the thermosetting resin, the working life (time) of the resulting combination becomes longer than that of the conventional thermosetting resin used alone and, at the same time, the contact bonding time required for in bonding two printed circuit boards together can be shortened.

The insulating acrylic adhesive component used in the invention is a copolymer of acrylic ester having an alkyl group of 1-4 carbon atoms and a maleimide derivative.

Concrete examples of the acrylic ester as referred to above are methyl acrylate, ethyl acrylate, n-propyl acrylate and butyl acrylate. These acrylic esters may be used either singly or in combination.

The maleimide derivative as mentioned above includes aromatic maleimide compounds, alicyclic maleimide compounds and aliphatic maleimide compounds. Concrete examples of the maleimide derivative include aromatic maleimide compounds such as phenyl maleimide and 2-methylphenyl maleimide, alicyclic maleimide compounds such as cyclohexyl maleimide and aliphatic maleimide compounds such as tert-butyl maleimide. These maleimide derivatives may be used either singly or in combination.

The insulating acrylic adhesive component constituting the insulating adhesive component of the compositions of the invention is a copolymer of acrylic ester and maleimide derivative as mentioned above, and this copolymer may be further copolymerized with $\alpha,\beta$-unsaturated carboxylic compounds, or salts or acid anhydrides (carboxylic acids) thereof.

The carboxylic acids usable in the above case are such compounds as having a carboxyl group and ethylenic double bond, and these compounds may contain other groups such as hydroxyl or alkyl group. Examples of such carboxylic acid compounds include acrylic acid, methacrylic acid, maleic acid and itaconic acid, alkali metal salts of these carboxylic acids and acid anhydrides of these carboxylic acids.

In the copolymer of the acrylic ester and maleimide derivative as mentioned above, the content of recurring units derived from the maleimide derivative is 0.5 to 15.0 parts, preferably 1.0 to 10.0 parts, more preferably 1.0 to 5.0 parts, by weight based on 100 parts by weight of the recurring units derived from the acrylic acid ester. In the case of this copolymer when further copolymerized with the carboxylic acids, the content of the recurring units derived from the carboxylic acids is usually 0.5 to 20 parts by weight, preferably 1.0 to 10 parts by weight based on 100 parts by weight of the recurring units derived from the acrylic acid ester.

Of the copolymers mentioned above, suitably usable are those having a weight average molecular weight of usually 100,00 to 500,000, preferably 100,000 to 300,000.

The thermosetting resin used in the insulation adhesive component of the composition of the invention, which is formed by curing reaction of thermosetting resin, includes phenolic resin, urea resin, melamine resin and benzoguanamine resin. The components used respectively for forming the above-mentioned thermosetting resins may be used so as to form a singly thermosetting resin or may be used in combination so as to form a plurality of thermosetting resins. Of such components mentioned above, particularly preferred are such components as capable of forming alkylphenol resins or allyl-modified phenolic resins, particularly xylene-modified phenolic resins. The thermosetting resins used herein are preferably those having a gel time, as measured by the method stipulated in JIS K 6910, of more than 60 seconds. By the use of the thermosetting resins having such gel time as defined above, the working life of the adhesive compositions of the invention can be preset to a suitable extent as desired.

The thermosetting resin as illustrated above may be used in an amount, based on 100 parts by weight of the above-mentioned copolymer, of usually 5 to 60 parts by weight, preferably 10 to 40 parts by weight.

The insulating adhesive component of the adhesive compositions of the invention is composed of the above-mentioned insulating acrylic adhesive component, thermosetting resin and coupling agent.

The coupling agent used herein may include, for example, azo coupling agents, isocyanate coupling agents, metal chelate coupling agents and silane coupling agents.

Of these coupling agents mentioned above, particularly preferred are silane coupling agents, and of the silane coupling agents, preferred are epoxysilane coupling agents.

In the present invention, the coupling agent is used in an amount, based on 100 parts by weight of the copolymer, of usually 0.05 to 5.0 parts by weight, preferably 0.1 to 1.0 part by weight.

By the use of such coupling agents as mentioned above, the adhesion strength between the substrate and the adhesive compositions of the invention is improved. Particularly, this effect is exhibited when the substrates to be bonded together are those made of glass, polyimide or polyester.

Furthermore, by virtue of the use of the coupling agent in the adhesive compositions of the invention, a good interfacially bonded state can be maintained between the substrates, irrespective of the kind thereof, and the adhesive composition applied thereto, thus there is observed no difference in values of electrical resistance of the bonded substrate, before and after application thereto of moisture and heat, and the conducting state between the circuit patterns of the bonded substrate can be maintained for a sufficiently extended period of time.

The foregoing is considered ascribable to the fact that the interfacial bonding state between the adhesive and substrates is improved by the use of the coupling agent in combination with the adhesive.

The insulating adhesive component of the adhesive compositions of the invention contains the above-mentioned insulating acrylic copolymer, thermoplastic resin and coupling agent in the predetermined proportions. In the present insulating adhesive compositions, it is possible to prevent the adhesive composition from squeezing-out from the edge portion of the substrate by adjusting the mixing proportions of the constituents of the insulating adhesive component so that the modulus of elasticity (G') at 200° C. of said insulating adhesive component becomes $10^5$–$10^7$ dyn/cm$^2$, preferably $10^6$–$10^7$ dyn/cm$^2$.

The adhesive compositions of the invention may be incorporated with a curing agent in order that the curing reaction of the thermosetting resin may proceed appropriately. Examples of the curing agent used for the intended purpose mentioned above include isocyanate curing agents, epoxy curing agents, metal chelate curing agents and melamine curing agents. These curing agents may be used either singly or in combination, taking their combination with the thermosetting resin used into account. Particularly, by the use of epoxy curing agents out of the curing agents mentioned above, it becomes possible to control favorably the fluidity of the adhesive composition of the invention at the time of heating and pressing in bonding operation of the substrates without exerting adverse influences on performance in adhesion of the present adhesive composition.

In the anisotropic conductive adhesive compositions of the present invention, specific metallic-layer containing particles are dispersed in the insulating adhesive component as mentioned above.

The anisotropic conductive adhesive composition containing the insulating adhesive component having such composition as mentioned above exhibit reliable performance at the time when it is perfectly cure and, at the same time, is apt to flow in comparison with the conventional anisotropic conductive adhesive compositions having thermosetting resins as the adhesive components, because heat curing of the insulating adhesive component does not proceed yet at the time of bonding the substrates with the adhesive composition, more particularly at the stage of heating and pressing the substrates to which said adhesive composition has been applied. Accordingly, by virtue of the use of the anisotropic conductive adhesive compositions containing such insulating adhesive component as mentioned above, it is possible to bond the substrates together in a relatively short contact bonding time.

Figure 1:
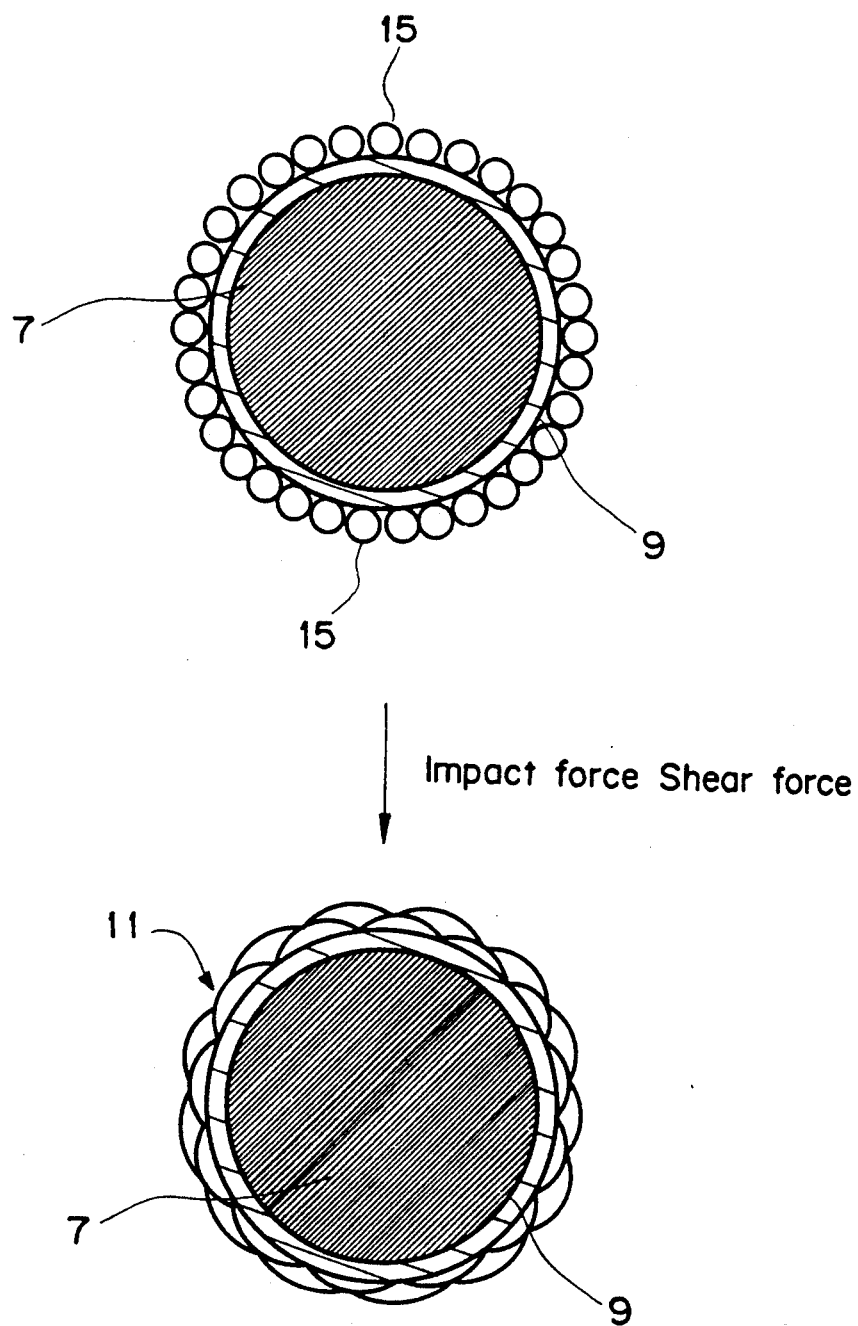
FIG. 1 shows schematically sectional view of the structures, before and after application of impact force and shear force thereto, of the metallic-layer containing particles (hereinafter sometimes referred to the metal containing particles) to be dispersed in the anisotropic conductive adhesive compositions of the present invention.

As shown in FIG. 1, the particles used in the anisotropic conductive adhesive compositions of the invention are composed of a core 7 made of resin, a metallic layer 9 covering the core 7 and a resin layer covering the metallic layer 9.

The resinous material used for preparing the core 7 is not particularly limited to specific ones but may be any resinous materials so long as they are insoluble in solvents for the adhesives, chemically stable and deformable to a certain extent under the bonding conditions for the substrates, for example, under the heating and pressing conditions.

Such resinous materials as used for preparing the core 7 include concretely, for example, polyethylene, polypropylene, polystyrene, acrylonitrile/styrene copolymer, acrylonitrile/butadiene/styrene copolymer, polycarbonate, various acrylates such as polymethyl methacrylate, polyvinyl butyral, polyvinyl formalin, polyimide, polyamide, polyester, polyvinyl chloride, polyvinylidene chloride, fluororesin, polyphenylene oxide, polyphenylene sulfite, polymethyl pentene, urea resin, melamine resin, benzoguanamine resin, phenol-formalin resin, phenolic resin, xylene resin, furan resin, diallyl phthalate resin, epoxy resin, polyisocyanate resin, phenoxy resin and silicone resin. Of these resinous materials exemplified above, particularly preferred are polypropylene, phenolic resin and silicone resin. These resinous materials may be used either singly or in combination. Further, these resinous materials may be suitably modified, or may be those having a crosslinked structure formed by reaction thereof with such additive as a crosslinking agent or curing agent, or may be cured resins.

The core 7 is prepared by granulation of these resinous materials according to the known method, and desirably has a uniform particle diameter. Concretely, the core 7 may be prepared by such method as emulsion polymerization, soap-free emulsion polymerization, seed emulsion polymerization, suspension polymerization, non-aqueous dispersion polymerization, dispersion polymerization, interfacial polymerization, in-situ polymerization, in-liquid cure coating method, in-liquid drying method, fusion dispersion cooling method and spray drying method.

The core 7 thus obtained has an average particle diameter of usually 1–48 $\mu$m, preferably 2–20 $\mu$m and especially 5–10 $\mu$m.

The metal used for forming metallic layer 9 covering the above-mentioned core 7 is not particularly limited to specific ones, and includes concretely such metal as Zn, Al, Sb, U, Cd, Ga, Ca, Au, Ag, Co, Sn, Se, Fe, Cu, Th, Pb, Ni, Pd, Be, Mg or Mn. The metals exemplified above may be used either singly or in combination, or may be incorporated with other elements or compounds for the purposes for improving such properties as hardness and surface tension.

Using these metals exemplified above, the metallic layer 9 may be formed on the surface of the core 7 by the known physical methods including such as deposition, sputtering, ion plating, plating and flame spraying. In addition thereto, there may be mentioned a chemical method which comprises chemically bonding a metal, if necessary, through a coupling agent to the surface of the core 7 composed of a resin having a functional group, a method which comprises adsorbing a metal to the surface of the core 7 using a surface active agent or the like, and a method which comprises dispersing metallic powder in the monomer at the time of preparing a resin for the core 7, and adsorbing said metallic powder onto the surface of the core 7 prepared from the resin as polymerized.

The metallic layer 9 thus formed is desirably attached to the core 7 so that the metallic layer 9 will deform following in the wake of deformation of the core material when the particles 3a are heated and pressed between the circuit patterns.

Further, this metallic layer 9 is not always necessary to be a single layer but may be those having laminated a plurality of metallic layers.

The metallic layer as illustrated above has a thickness of usually of 0.01–10.0 $\mu$m, preferably 0.05–5 $\mu$m and especially 0.2–2 $\mu$m. Further, the metallic layer 9 has such a thickness that the ratio of the thickness of the metallic layer 9/the diameter of the core 7 is usually 1/50 to 1/5, preferably 1/20 to 1/10.

The metallic-layer containing particles 3 used in the invention has a resin layer 11 which covers the metallic layer 9 formed on the surface of the core 7. This resin layer 11 may be formed by fixing finely divided particulate resin 15 on the surface of the metallic layer 9 by means of the dry blending method. In general, as a method of forming a resin layer on the surface of metal, there have been known such methods as in-liquid cure coating method, phase separating method, in-liquid drying method, spray drying method, in-air suspension coating method, and dry blending method (mechanochemical method). In preparing the metallic-layer containing particles 3 used in the invention, however, the dry blending method is employed out of the methods as mentioned above to form the resin layer 11 as above. The resin layer formed on the metal surface by the dry blending method is found to be most uniform, and the metallic-layer containing particles having such resin layer as mentioned above is excellent in solvent resistance and also shows a high degree of reliability on current conduction when heated and pressed between the circuit patterns.

Materials for the finely divided particulate resin 15 used for forming the above-mentioned resin layer 11 are those which are capable of forming said resin layer 11 insoluble in solvents used sometimes for dissolving the insulation adhesive component and easily releasable from the surface of the metallic layer 9 on heating and pressing at the time of bonding the substrates together, or capable of exposing the metallic layer 9 when the resin layer 11 is deformed. Concrete examples of the resin for forming such particulate resin 15 include fluororesin, acrylic resin, benzoguanamine resin, styrene resin, carnauba wax, polypropylene and polyethylene. These resins mentioned above may be used either singly or in combination, or may be those having a crosslinked structure formed by reaction with a crosslinking agent. Of these resins, particularly preferred is fluororesin.

The particulate resin 15 may be prepared from ordinary resins by the usual method, for example, emulsion polymerization, soap-free emulsion polymerization, dispersion polymerization, suspension polymerization, interfacial polymerization, in-liquid drying method, fusion dispersion cooling method and mechanical pulverization method.

Of the particulate resin 15 obtained by the above-mentioned method, those used in the present invention have the particle diameter ratio (particle diameter of the particulate resin 15/particle diameter of the core 7) of usually 1/50 to 1/5, preferably 1/20 to 1/10, and an average particle diameter of usually 0.01 to 5 $\mu$m, preferably 0.1 to 2 $\mu$m and especially 0.2 to 1 $\mu$m.

The resin layer 11 is formed by the dry blending method using the particulate resin 15 as illustrated above, that is, the core 7 having the metallic layer 9 thereon and the particulate resin 15 are mixed together without the intervention of any liquid and, if necessary, compression force, shearing force or impact force is applied thereto.

The dry blending method mentioned above may be carried out concretely, for example, by the following manner.

(a) The particulate resin 15 and the core 7 having the metallic layer 9 thereon are introduced into a commercially available hybridization system (the Nara's system of hybridization, manufactured and sold by Nara Kikai Seisakusho K. K.) or a methanofusion system (manufactured and sold by Hosokawa Micron K. K.), and treated therewith under application of impact force and shear force while heating at a temperature of 20° to 200° C., preferably 80° to 130° C.

(b) The particulate resin 15 and the core 7 having the metallic layer 9 thereon are introduced into a ball mill or a container equipped with a stirring blade, and treated therewith under application of shear force while heating at a temperature of 20° to 200° C., preferably 50° to 120° C.

The resin layer 11 thus formed has a thickness of usually 1/50 to 1/5, preferably 1/20 to 1/10 of the average particle diameter of the core 7, and the thickness of said resin layer 11 is usually 0.01 to 5 $\mu$m, preferably 0.1 to 2 $\mu$m and especially 0.2 to 1 $\mu$m.

The metallic-layer containing particle comprising the above-mentioned core 7, metallic layer 9 and resin layer 11 has an average particle diameter of usually 1 to 50 $\mu$m, preferably 2 to 30 $\mu$m and especially 5 to 15 $\mu$m.

The metallic-layer containing particles as mentioned above are contained in the adhesive composition of the invention in an amount, based on 100 parts by weight of the insulating adhesive component of said composition, of usually 5 to 100 parts by weight, preferably 20 to 60 parts by weight.

The above-mentioned metallic-layer containing particles do not exhibit conductibility in the adhesive composition of the invention, because they have a resin layer covering the whole surface thereof. However, when the boards having formed a circuit pattern on one side are bonded together by means of the anisotropic conductive adhesive composition of the invention so that the patterns face each other, the resin layers of the metallic-layer containing particles lie between the circuit patterns are destroyed by the heating and pressing at the time of bonding operation, and the thus destroyed metallic-layer containing particles come to have conductibility. On one hand, the metallic-layer containing particles lying between the surface of the substrates having no circuit pattern on said surfaces can retain their insulating properties, because the resin layers of the metallic-layer containing particles are not destroyed by the pressure applied thereto, said pressure being relatively small. Accordingly, in the printed circuit boards bonded together by using the adhesive composition of the invention, the conductibility is exhibited in the portions of the boards on which the circuit patterns are formed, and the insulated state can be maintained at the portions of the boards on which no circuit pattern is formed. By virtue of the use of the adhesive composition of the invention in bonding the printed circuit boards together, only the specific portions come to have conductibility in the manner as mentioned above, it is possible to inhibit effectively a short circuit between the contiguous circuit patterns. Because of a small difference in gravity between the metallic-layer containing particle containing a resin as the core and the insulating adhesive component, the metallic-layer containing particles are dispersed favorably in the adhesive composition of the invention.

In the anisotropic conductive adhesive compositions of the invention having such excellent characteristics as mentioned above, it is also possible to suitably regulate flowability of the composition by the addition thereto of inorganic particles having a specific particles diameter, so that the metallic-layer containing particles exhibit good flow behavior in the composition at the time of the bonding operation.

That is, the anisotropic conductive adhesive compositions of the present invention may be further incorporated with inorganic particles. The inorganic particles that can be used herein are those having the average particle diameter ratio of the inorganic particles/the metallic-layer containing particles of not more than 1/10, preferably 1/20 to 1/1000. The inorganic particles as illustrated above are those obtained from insulating inorganic materials. The inorganic particles used in the invention have an average particle diameter of usually 0.01 to 5.0 $\mu$m, preferably 0.02 to 1.0 $\mu$m.

Concrete examples of the inorganic particles as illustrated above include those of titanium oxide, silicon dioxide, calcium carbonate, calcium phosphate, aluminum oxide and antimony trioxide. These inorganic particles as exemplified above may be used either singly or in combination.

The inorganic particles mentioned above are incorporated into the adhesive composition of the invention in an amount, based on 100 parts by weight of the insulating adhesive component, of usually 1.0 to 50.0 parts by weight, preferably 5.0 to 25.0 parts by weight.

The proportion in the adhesive composition of the invention of the metallic-layer containing particles to the inorganic particles is 3:1 to 1:1 in terms of weight, and the adhesive composition containing these two kinds of particles in the proportion as defined above will come to exhibit preferred flow behavior at the time of contact bonding operation.

By virtue of the incorporation of the inorganic particles in the manner now described, it is possible to regulate flowability of the adhesive compositions of the invention used at the time of bonding the printed circuit boards with heat and under pressure. Accordingly, when the adhesive compositions containing the above-mentioned inorganic particles are used in bonding the printed circuit boards together with heat and under pressure, practically no squeeze-out of the adhesive composition from the edge portion of the bonded circuit board will occur.

The anisotropic conductive adhesive compositions of the invention may be used in various forms such as sheet, paste and the like.

For example, as shown in FIG. 2, the adhesive composition of the invention can be used in a sheet-like form comprising the insulating adhesive component 1 having dispersed therein the metallic-layer containing particles 3 and the inorganic particles 30. In FIG. 2, the adhesive composition in the sheet-like form of the invention is represented by Arabic numeral 5.

When two pieces of the substrates, each having formed a circuit pattern thereon, are bonded together using the adhesive composition 5 of the invention formed into the sheet-like form, the two pieces of the substrates 21 each having formed the circuit pattern thereon are arranged so that the circuits 20 are faced to each other through the sheet 5.

The substrates 21 thus arranged are then pressed with heat in the direction of the sheet so as to approach to each other.

By heating and pressing the two pieces of substrates in the manner as mentioned above, the space between said two substrates is filled with the adhesive composition of the invention as shown in FIG. 3, whereby the substrates 21 are bonded together. In the substrates thus bonded, the metallic-layer containing particles 3a in the adhesive composition of the invention are held between the circuit portions 20 and, at the same time, the resin layers 11, i.e. the outermost shells of the metallic-layer containing particles 3a, are destroyed by the pressure applied thereto at the time of bonding said two substrates together, and the metallic layers 9 of the particles 3a are exposed to exhibit conductibility. The particles 3a held between the circuit portions 20 connect the circuits 20 to each other electrically.

The anisotropic conductive adhesive compositions of the present invention contain the insulating adhesive component 1, metallic-layer containing particles 3 and preferably inorganic particles 30, and by using such adhesive compositions as obtained according to the invention in bonding the printed circuit boards together in the manner as mentioned previously, the particles 3a held between the circuit patterns 20 can be fixed stably for a long period of time. In addition thereto, it is also possible to maintain the above-mentioned stably fixed state of the particles 3a even under the circumstances of high temperature, because the adhesive compositions of the invention contain the insulating acrylic adhesive and thermosetting resin as the insulating adhesive component.

Furthermore, by the incorporation into the adhesive compositions of the invention of the coupling agent as the insulating adhesive component, the state of interface between the substrates and the adhesive composition of the invention is improved to enhance the bonding strength.

The adhesive compositions of the invention as illustrated above may be formulated into a sheet-like adhesive by employing various coating methods, for example, those relying on the use of various coating means such as a knife coater, comma coater, reverse-roll coater and gravure coater.

In addition to the above-mentioned sheet-like adhesive, the anisotropic conductive adhesive compositions of the invention may also be used in a paste-like form by mixing them with a suitable solvent. The paste-like adhesive composition of the invention may be coated by using a coater, for example, a screen coater or the like, on the substrate to form an adhesive layer thereof.

EFFECT OF THE INVENTION

Because the anisotropic conductive adhesive compositions of the present invention are those formed from an insulating adhesive component comprising a copolymer of acrylic ester having an alkyl group of 1-4 carbon atoms and a maleimide derivative, a thermosetting resin and a coupling agent, and metallic-layer containing particles dispersed in said insulating adhesive component, and the metallic-layer containing particles have a core made of resin, a metallic layer covering the core and a resin layer formed on the metallic layer by fixing finely divided resin by the dry blending method to the surface of the metallic layer, when two printed circuit boards are bonded together with the adhesive compositions of the invention as illustrated above, the contiguous circuit patterns of the bonded board will not short-circuit. Further, the metallic-layer containing particles are well dispersed in the insulating adhesive component, because the resin is used as the core of said particles, and the metallic-layer containing particles held between the circuit patterns at the time of the bonding operation will come to have conductibility, because the resin layer constituting the outermost shell of the metallic-layer containing particles are destroyed by the pressure applied thereto and, at the same time, poor conduction of the current between the circuit patterns will hardly occur, because the contact surface of the metallic-layer containing particles with said circuit patterns becomes large.

In addition thereto, by incorporating the inorganic particles small in particle diameter into the anisotropic conductive compositions of the invention, the flowability of the composition at the time of bonding operation of the printed circuit boards can be controlled so that the metallic-layer containing particles in said composition can be held between the circuit patterns in a favorable manner as expected, hence the stabilized conduction of the current between the circuit patterns can be obtained.

Furthermore, the addition to the anisotropic conductive adhesive compositions of the coupling agent as aforesaid makes it possible to maintain the above-mentioned initial conduction of the current for an extended period of time so as to be less in change with time, because the printed circuit boards are firmly bonded together with the compositions containing the coupling agent so that the metallic-layer containing particles held between the circuit patterns are retained as they are.

The present invention is illustrated below with reference to examples, but it should be construed that the invention is in no way limited to those example.

EXAMPLE

1) Commercially available phenolic resin particles in a sphere form (classified by air classification into spheres of 6-12 μm (80% by weight) and those of 3-6 μm (80% by weight) used as the core were electrolessly plated with nickel and gold in two layers to obtain metal coated particles as mentioned below.

| | |
|---|---|
| 1-1 | 6-12 μm core/Ni/Au = 4/4/2 in weight ratio |
| 1-2 | 3-6 μm core/Ni/Au = 4/4/2 in weight ratio |
| 1-3 | 6-12 μm core/Ni/Au = 45/45/10 in weight ratio |
| 1-4 | 3-6 μm core material/Ni/Au = 45/45/10 in weight ratio |

2) A mixture of 100 parts by weight of the metal coated particles 1-1 and 10 parts by weight of a commercially available finely divided vinylidene fluoride resin was treated with a hybridization system at 100° C. for 5 minutes to obtain fluororesin-coated metallic-layer containing particles. (1-1 H)

In the manner similar to the above, the metal containing particles 1-2, 1-3 and 1-4 were treated to obtain the following fluororesin-coated metal containing particles.

| Particle | Average particle diameter | Thickness (core/metallic layer/resin layer) |
|---|---|---|
| 1-1 H | 11.2 μm | 10 μm/0.3 μm/0.3 μm |
| 1-2 H | 5.6 μm | 5 μm/0.15 μm/0.15 μm |
| 1-3 H | 11.1 μm | 10 μm/0.3 μm/0.25 μm |
| 1-4 H | 5.6 μm | 5 μm/0.15 μm/0.15 μm |

3) An acrylic ester copolymer was prepared by polymerizing monomers having the following composition in a toluene solution. The copolymer thus prepared had a weight average molecular weight of 300,000.

To the copolymer obtained above was added 10 parts by weight of an alkylphenolic resin (CKM-1634, a product of Showa Kobunshi K. K., gel time: 180 seconds), whereby an adhesive composition was obtained. (3-1)

| Monomer composition (by weight) | |
|---|---|
| Methyl acrylate | 70% |
| Butyl acrylate | 20% |
| Metacrylic acid | 5% |
| 2-methylphenylmaleimide | 5% |

4) The same procedure as described in the foregoing 3) was repeated except that the monomer composition was changed to that indicated in the following.

| Monomer composition (by weight) | |
|---|---|
| Methyl acrylate | 45% |
| Ethyl acrylate | 45% |
| Acrylic acid | 5% |
| Phenylmaleimide | 5% |

The copolymer thus prepared had a weight average molecular weight of 300,000.

To the copolymer thus obtained was added 10 parts by weight of an alkylphenolic resin (CKM-1634, a product of Showa Kobunshi K. K. gel time: 180 seconds). Thus, there was obtained an insulating adhesive component. (3-2)

5) The same procedure as described in the foregoing 3) was repeated except that the monomer composition was changed to that indicated in the following.

| Monomer composition (by weight) | |
|---|---|
| Methyl acrylate | 70% |
| Butyl acrylate | 20% |
| Acrylic acid | 5% |
| Phenylmaleimide | 5% |

The copolymer thus prepared had a weight average molecular weight of 300,000.

To the copolymer thus obtained was added 10 parts by weight of an alkylphenolic resin (CKM-1634, a product of Showa Kobunshi K. K. gel time: 180 seconds). Thus, there was obtained an insulating adhesive component. (3-3)

6) The same procedure as described in the foregoing 3) was repeated except that the monomer composition was changed to that indicated in the following.

| Monomer composition (by weight) | |
|---|---|
| Methyl acrylate | 65% |
| Butyl acrylate | 20% |
| Acrylic acid | 5% |
| Phenylmaleimide | 10% |

The copolymer thus prepared had a weight average molecular weight of 300,000.

To the copolymer thus obtained was added 10 parts by weight of an alkylphenolic resin (CKM-1634, a product of Showa Kobunshi K. K. gel time: 180 seconds). Thus, there was obtained an insulating adhesive component. (3-4)

7) The same procedure as described in the foregoing 3) was repeated except that the monomer composition was changed to that indicated in the following.

| Monomer composition (by weight) | |
|---|---|
| Methyl acrylate | 75% |
| Butyl acrylate | 20% |
| Acrylic acid | 5% |

The copolymer thus prepared had a weight average molecular weight of 300,000.

To the copolymer thus obtained was added 10 parts by weight of an alkylphenolic resin (CKM-1634, a product of Showa Kobunshi K. K. gel time: 180 seconds). Thus there was obtained an insulating adhesive component. (3-5)

8) The same procedure as described in the foregoing 3) was repeated except that the monomer composition was changed to that indicated in the following and the same alkylphenolic resin as used in the foregoing 3) was not used.

| Monomer composition (by weight) | |
|---|---|
| Methyl acrylate | 70% |

-continued

| Monomer composition (by weight) | |
|---|---|
| Butyl acrylate | 20% |
| Acrylic acid | 5% |
| Phenylmaleimide | 5% |

The copolymer thus prepared had a weight average molecular weight of 300,000.

Thus, there was obtained an insulating adhesive component containing no thermosetting resin. (3-6)

EXAMPLE 1

An anisotropic conductive adhesive composition obtained by thoroughly mixing together the following components was spread and dried to prepare a sheet-like adhesive composition of 25 μm in thickness.

| | Part by weight |
|---|---|
| Insulating adhesive component 3-1 | 100 |
| Coupling agent | 0.5 |
| (KBM 303, a product of Shinetsu Silicon K.K.) | |
| Curing agent (polyglycidyl xyleneamine) | 1 |
| Metallic-layer containing particles 1-1H | 10 |
| Titanium oxide particles | 5 |
| (particle diameter 0.02 μm) | |

EXAMPLE 2

A sheet-like adhesive composition of 25 μm in thickness was prepared by repeating Example 1 except that the following components were used instead.

| | Part by weight |
|---|---|
| Insulating adhesive component 3-1 | 100 |
| Coupling agent (the same as in Ex. 1) | 0.5 |
| Curing agent (the same as in Ex. 1) | 1 |
| Metallic-layer containing particles 1-2H | 10 |
| Titanium oxide particles | 5 |
| (the same as in Ex. 1) | |

EXAMPLE 3

A sheet-like adhesive composition of 25 μm in thickness was prepared by repeating Example 1 except that the following components were used instead.

| | Part by weight |
|---|---|
| Insulating adhesive component 3-1 | 100 |
| Coupling agent (the same as in Ex. 1) | 0.5 |
| Curing agent (the same as in Ex. 1) | 1 |
| Metallic-layer containing particles 1-3H | 10 |
| Titanium oxide particles | 5 |
| (the same as in Ex. 1) | |

EXAMPLE 4

A sheet-like adhesive composition of 25 μm in thickness was prepared by repeating Example 1 except that the following components were used instead.

| | Part by weight |
|---|---|
| Insulating adhesive component 3-1 | 100 |
| Coupling agent (the same as in Ex. 1) | 0.5 |
| Curing agent (the same as in Ex. 1) | 1 |
| Metallic-layer containing particles 1-4H | 10 |
| Titanium oxide particles | 5 |
| (the same as in Ex. 1) | |

EXAMPLE 5

A sheet-like adhesive composition of 25 μm in thickness was prepared by repeating Example 1 except that the following components were used instead.

| | Part by weight |
|---|---|
| Insulating adhesive component 3-2 | 100 |
| Coupling agent (the same as in Ex. 1) | 0.5 |
| Curing agent (the same as in Ex. 1) | 1 |
| Metallic-layer containing particles 1-1H | 10 |
| Titanium oxide particles | 5 |
| (the same as in Ex. 1) | |

EXAMPLE 6

A sheet-like adhesive composition of 25 μm in thickness was prepared by repeating Example 1 except that the following components were used instead.

| | Part by weight |
|---|---|
| Insulating adhesive component 3-2 | 100 |
| Coupling agent (the same as in Ex. 1) | 0.5 |
| Curing agent (the same as in Ex. 1) | 1 |
| Metallic-layer containing particles 1-2H | 10 |
| Titanium oxide particles | 5 |
| (the same as in Ex. 1) | |

EXAMPLE 7

A sheet-like adhesive composition of 25 μm in thickness was prepared by repeating Example 1 except that the following components were used instead.

| | Part by weight |
|---|---|
| Insulating adhesive component 3-3 | 100 |
| Coupling agent (the same as in Ex. 1) | 0.5 |
| Curing agent (the same as in Ex. 1) | 1 |
| Metallic-layer containing particles 1-1H | 10 |
| Titanium oxide particles | 5 |
| (the same as in Ex. 1) | |

EXAMPLE 8

A sheet-like adhesive composition of 25 μm in thickness was prepared by repeating Example 1 except that the following components were used instead.

| | Part by weight |
|---|---|
| Insulating adhesive component 3-4 | 100 |
| Coupling agent (the same as in Ex. 1) | 0.5 |
| Curing agent (the same as in Ex. 1) | 1 |
| Metallic-layer containing particles 1-1H | 10 |
| Titanium oxide particles | 5 |
| (the same as in Ex. 1) | |

EXAMPLE 9

A sheet-like adhesive composition of 25 μm in thickness was prepared by repeating Example 1 except that the following components were used instead.

|                                          | Part by weight |
|------------------------------------------|----------------|
| Insulating adhesive component 3-1        | 100            |
| Coupling agent (the same as in Ex. 1)    | 0.5            |
| Curing agent (the same as in Ex. 1)      | 1              |
| Metallic-layer containing particles 1-1H | 10             |
| Titanium oxide particles (particle diameter 5.0 μm) | 5   |

EXAMPLE 10

A sheet-like adhesive composition of 25 μm in thickness was prepared by repeating Example 1 except that the following components were used instead.

|                                          | Part by weight |
|------------------------------------------|----------------|
| Insulating adhesive component 3-1        | 100            |
| Coupling agent (the same as in Ex. 1)    | 0.5            |
| Curing agent (the same as in Ex. 1)      | 1              |
| Metallic-layer containing particles 1-1H | 10             |
| Titanium oxide particles (the same as in Ex. 1) | 10      |

COMPARATIVE EXAMPLE 1

A sheet-like adhesive composition of 25 μm in thickness was prepared by repeating Example 1 except that the following components were used instead.

|                                          | Part by weight |
|------------------------------------------|----------------|
| Insulating adhesive component 3-1        | 100            |
| Coupling agent (the same as in Ex. 1)    | 1              |
| Curing agent (the same as in Ex. 1)      | 1              |
| Metallic-layer containing particles 1-1  | 10             |
| Titanium oxide particles (the same as in Ex. 1) | 5       |

COMPARATIVE EXAMPLE 2

A sheet-like adhesive composition of 25 μm in thickness was prepared by repeating Example 1 except that the following components were used instead.

|                                          | Part by weight |
|------------------------------------------|----------------|
| Insulating adhesive component 3-1        | 100            |
| Coupling agent (the same as in Ex. 1)    | 1              |
| Curing agent (the same as in Ex. 1)      | 1              |
| Metallic-layer containing particles 1-2  | 10             |
| Titanium oxide particles (the same as in Ex. 1) | 5       |

COMPARATIVE EXAMPLE 3

A sheet-like adhesive composition of 25 μm in thickness was prepared by repeating Example 1 except that the following components were used instead.

|                                          | Part by weight |
|------------------------------------------|----------------|
| Insulating adhesive component 3-5        | 100            |
| Coupling agent (the same as in Ex. 1)    | 1              |
| Curing agent (the same as in Ex. 1)      | 1              |
| Metallic-layer containing particles 1-1H | 10             |
| Titanium oxide particles (the same as in Ex. 1) | 5       |

COMPARATIVE EXAMPLE 4

A sheet-like adhesive composition of 25 μm in thickness was prepared by repeating Example 1 except that the following components were used instead.

|                                          | Part by weight |
|------------------------------------------|----------------|
| Insulating adhesive component 3-6        | 100            |
| Coupling agent (the same as in Ex. 1)    | 1              |
| Curing agent (the same as in Ex. 1)      | 1              |
| Metallic-layer containing particles 1-1H | 10             |
| Titanium oxide particles (the same as in Ex. 1) | 5       |

COMPARATIVE EXAMPLE 5

A sheet-like adhesive composition of 25 μm in thickness was prepared by repeating Example 1 except that the following components were used instead.

|                                          | Part by weight |
|------------------------------------------|----------------|
| Insulating adhesive component 3-1        | 100            |
| Curing agent (the same as in Ex. 1)      | 1              |
| Metallic-layer containing particles 1-1H | 10             |
| Titanium oxide particles (the same as in Ex. 1) | 5       |

As printed circuit boards, there were prepared a polyimide film having printed thereon copper foils as a pitch of 70 μm and a glass plate having sputtered thereon ITO at a pitch of 70 μm. The boards thus prepared were bonded together under the following contact bonding conditions by interposing each of the sheet-like adhesive compositions prepared in Examples 1-10 and Comparative Examples 1-5 between said boards as shown in FIG. 4.

| Contact bonding conditions I: 150° C. × 30 kg/cm² × 5 sec   | Table 1 |
| Contact bonding conditions II: 180° C. × 30 kg/cm² × 5 sec  | Table 2 |
| Contact bonding conditions III: 210° C. × 30 kg/cm² × 5 sec | Table 3 |
| Contact bonding conditions IV: 180° C. × 15 kg/cm² × 5 sec  | Table 4 |
| Contact bonding conditions V: 180° C. × 30 kg/cm² × 3 sec   | Table 5 |

The printed circuit boards thus bonded were allowed to stand at 40° C. for 2 days to measure resistivities of the upper and lower electrodes, and the bonded board was placed for 14 days under the conditions of 60° C. and 90% RH to measure a resistivity between the upper and lower electrodes, insulation properties between the right and left electrodes, and a peeling strength at 90° C. and a width of 10 mm (rate of pulling: 50 mm/min).

Results obtained are shown in Tables 1 to 5.

TABLE 1

| Example | Conductivity (Ω) | Wet Conductivity (Ω) | Insulation properties (Ω) | Bond strength (g/10 mm) |
|---------|------------------|----------------------|---------------------------|-------------------------|
| 1       | 2                | 5                    | 10¹⁰ or higher            | 500                     |
| 2       | 5                | 7                    | 10¹⁰ or higher            | 480                     |
| 3       | 2                | 4                    | 10¹⁰ or higher            | 500                     |
| 4       | 4                | 7                    | 10¹⁰ or higher            | 490                     |
| 5       | 2                | 4                    | 10¹⁰ or higher            | 700                     |

TABLE 1-continued

| | Conduc- tivity (Ω) | Wet Conduc- tivity (Ω) | Insulation properties (Ω) | Bond strength (g/10 mm) |
|---|---|---|---|---|
| 6 | 2 | 5 | 10^10 or higher | 710 |
| 7 | 3 | 6 | 10^10 or higher | 600 |
| 8 | 3 | 5 | 10^10 or higher | 550 |
| 9 | 4 | 7 | 10^10 or higher | 490 |
| 10 | 3 | 5 | 10^10 or higher | 400 |
| Comparative Example | | | | |
| 1 | 3 | 5 | *)10–10^10 | 500 |
| 2 | 5 | 6 | *)10–10^10 | 510 |
| 3 | 15 | 360 | 10^10 or higher | 450 |
| 4 | 10 | 1000 | 10^10 or higher | 400 |
| 5 | 5 | 700 | 10^10 or higher | 450 |

*)Insulation properties between the polyimide film and glass plate as measured varied markedly according to the position of the bonded substrate at which the measurement was conducted. This fact indicates that the sheet-like adhesive composition used for bonding the polyimide film and glass plate together was poor in insulation properties.

TABLE 2

| | Conduc- tivity (Ω) | Wet Conduc- tivity (Ω) | Insulation properties (Ω) | Bond strength (g/10 mm) |
|---|---|---|---|---|
| Example | | | | |
| 1 | 3 | 4 | 10^10 or higher | 550 |
| 2 | 4 | 6 | 10^10 or higher | 570 |
| 3 | 2 | 3 | 10^10 or higher | 570 |
| 4 | 4 | 5 | 10^10 or higher | 550 |
| 5 | 3 | 4 | 10^10 or higher | 800 |
| 6 | 4 | 5 | 10^10 or higher | 850 |
| 7 | 5 | 4 | 10^10 or higher | 700 |
| 8 | 2 | 3 | 10^10 or higher | 650 |
| 9 | 3 | 3 | 10^10 or higher | 540 |
| 10 | 4 | 4 | 10^10 or higher | 500 |
| Comparative Example | | | | |
| 1 | 2 | 4 | *)10–10^10 | 600 |
| 2 | 4 | 4 | *)10–10^10 | 590 |
| 3 | 12 | 300 | 10^10 or higher | 490 |
| 4 | 15 | 1000 | 10^10 or higher | 450 |
| 5 | 6 | 750 | 10^10 or higher | 490 |

*)Insulation properties between the polyimide film and glass plate as measured varied markedly according to the position of the bonded substrate at which the measurement was conducted. This fact indicates that the sheet-like adhesive composition used for bonding the polyimide film and glass plate together was poor in insulation properties.

TABLE 3

| | Conduc- tivity (Ω) | Wet Conduc- tivity (Ω) | Insulation properties (Ω) | Bond strength (g/10 mm) |
|---|---|---|---|---|
| Example | | | | |
| 1 | 3 | 6 | 10^10 or higher | 570 |
| 2 | 5 | 4 | 10^10 or higher | 590 |
| 3 | 2 | 5 | 10^10 or higher | 590 |
| 4 | 4 | 5 | 10^10 or higher | 600 |
| 5 | 3 | 4 | 10^10 or higher | 1000 |
| 6 | 2 | 4 | 10^10 or higher | 980 |
| 7 | 2 | 5 | 10^10 or higher | 810 |
| 8 | 5 | 7 | 10^10 or higher | 690 |
| 9 | 4 | 6 | 10^10 or higher | 650 |
| 10 | 3 | 5 | 10^10 or higher | 600 |
| Comparative Example | | | | |
| 1 | 3 | 4 | *)10–10^10 | 710 |
| 2 | 4 | 5 | *)10–10^10 | 640 |
| 3 | 80 | 500 | 10^10 or higher | 530 |
| 4 | 20 | 900 | 10^10 or higher | 530 |
| 5 | 5 | 700 | 10^10 or higher | 540 |

*)Insulation properties between the polyimide film and glass plate as measured varied markedly according to the position of the bonded substrate at which the measurement was conducted. This fact indicates that the sheet-like adhesive composition used for bonding the polyimide film and glass plate together was poor in insulation properties.

TABLE 4

| | Conduc- tivity (Ω) | Wet Conduc- tivity (Ω) | Insulation properties (Ω) | Bond strength (g/10 mm) |
|---|---|---|---|---|
| Example | | | | |
| 1 | 2 | 4 | 10^10 or higher | 400 |
| 2 | 4 | 8 | 10^10 or higher | 410 |
| 3 | 3 | 5 | 10^10 or higher | 420 |
| 4 | 2 | 6 | 10^10 or higher | 390 |
| 5 | 5 | 9 | 10^10 or higher | 550 |
| 6 | 4 | 9 | 10^10 or higher | 560 |
| 7 | 4 | 8 | 10^10 or higher | 500 |
| 8 | 3 | 6 | 10^10 or higher | 490 |
| 9 | 2 | 7 | 10^10 or higher | 400 |
| 10 | 4 | 7 | 10^10 or higher | 280 |
| Comparative Example | | | | |
| 1 | 3 | 4 | *)10–10^10 | 410 |
| 2 | 4 | 8 | *)10–10^10 | 420 |
| 3 | 17 | 270 | 10^10 or higher | 370 |
| 4 | 9 | 830 | 10^10 or higher | 350 |
| 5 | 4 | 630 | 10^10 or higher | 370 |

*)Insulation properties between the polyimide film and glass plate as measured varied markedly according to the position of the bonded substrate at which the measurement was conducted. This fact indicates that the sheet-like adhesive composition used for bonding the polyimide film and glass plate together was poor in insulation properties.

TABLE 5

| | Conduc- tivity (Ω) | Wet Conduc- tivity (Ω) | Insulation properties (Ω) | Bond strength (g/10 mm) |
|---|---|---|---|---|
| Example | | | | |
| 1 | 3 | 6 | 10^10 or higher | 350 |
| 2 | 4 | 6 | 10^10 or higher | 350 |
| 3 | 3 | 7 | 10^10 or higher | 320 |
| 4 | 5 | 9 | 10^10 or higher | 340 |
| 5 | 2 | 8 | 10^10 or higher | 400 |
| 6 | 2 | 8 | 10^10 or higher | 420 |
| 7 | 3 | 6 | 10^10 or higher | 400 |
| 8 | 2 | 7 | 10^10 or higher | 370 |
| 9 | 4 | 6 | 10^10 or higher | 290 |
| 10 | 4 | 6 | 10^10 or higher | 250 |
| Comparative Example | | | | |
| 1 | 4 | 7 | *)10–10^10 | 360 |
| 2 | 4 | 8 | *)10–10^10 | 370 |
| 3 | 15 | 250 | 10^10 or higher | 290 |
| 4 | 7 | 1100 | 10^10 or higher | 280 |
| 5 | 2 | 780 | 10^10 or higher | 320 |

*)Insulation properties between the polyimide film and glass plate as measured varied markedly according to the position of the bonded substrate at which the measurement was conducted. This fact indicates that the sheet-like adhesive composition used for bonding the polyimide film and glass plate together was poor in insulation properties.

What is claimed is:

1. An anisotropic conductive adhesive composition comprising an insulating adhesive component and particles dispersed in said insulating adhesive component, said anisotropic conductive adhesive composition being characterized in that said insulating adhesive component comprises a copolymer of acrylic ester having an alkyl group of 1-4 carbon atoms and a maleimide derivative, 5 to 60 parts by weight, based on 100 parts by weight of the copolymer, of a thermosetting resin, and 0.05 to 5.0 parts by weight, based on 100 parts by weight of the copolymer, of a coupling agent, and said particles are metallic-layer containing particles comprising a core made of resin, a metallic layer covering said core and a resin layer formed from finely divided resin fixed by the dry blending method on the surface of said metallic layer.

2. The anisotropic conductive adhesive composition as claimed in claim 1 wherein the amount of recurring units derived from the maleimide derivative contained in the copolymer is 0.5 to 10.0 parts by weight based on 100 parts by weight of the recurring units derived from acrylic ester contained in said copolymer.

3. The anisotropic conductive adhesive composition as claimed in claim 1 wherein the finely divided resin constituting the resin layer of the metallic layer containing particles is finely divided fluororesin.

4. An anisotropic conductive adhesive composition comprising an insulating adhesive component, particles dispersed in said insulating adhesive component and inorganic particles, said anisotropic conductive adhesive composition being characterized in that said insulating adhesive component comprises a copolymer of acrylic ester having an alkyl group of 1-4 carbon atoms and a maleimide derivative, 5 to 60 parts by weight, based on 100 parts by weight of the copolymer, of a thermosetting resin, and 0.05 to 5.0 parts by weight, based on 100 parts by weight of the copolymer, of a coupling agent, and said particles are metallic-layer containing particles comprising a core made of resin, a metallic layer covering said core and a resin layer formed from finely divided resin fixed by the dry blending method on the surface of said metallic layer, and said inorganic particles have an average particle diameter of not more than 1/10 of the average particle diameter of said metallic-layer containing particles.

5. The anisotropic conductive adhesive composition as claimed in claim 4 wherein the metallic-layer containing particles have an average particle diameter of 1 to 50 $\mu$m, and the inorganic particles have an average particle diameter of 0.01 to 5.0 $\mu$m.

6. The anisotropic conductive adhesive composition as claimed in claim 4 wherein the amount of the recurring units derived from the maleimide derivative contained in the copolymer is 0.5 to 10.0 parts by weight based on 100 parts by weight of the recurring units derived from acrylic ester contained in said copolymer.

7. The anisotropic conductive adhesive composition as claimed in claim 4 wherein the finely divided resin constituting the resin layer of the metal containing particles is finely divided fluororesin.

* * * * *

UNITED STATES PATENT AND TRADEMARK OFFICE
CERTIFICATE OF CORRECTION

PATENT NO. : 5,162,087
DATED : November 10, 1992
INVENTOR(S) : Hidemoto Fukuzawa, Tatsuhiro Imai, Yasuhiro Okada and Noriyuki Ousaka It is certified that error appears in the above-identified patent and that said Letters Patent is hereby corrected as shown below:

Cover page, after [75] Inventors: "Koganei" should read --Tokyo--
and "Sayama", "Iruma" and "Sayama" should read --Saitama--
On title page, item [56]
    under References Cited U.S. PATENT DOCUMENTS
   "5,021,487 1/1991 Klemarczuk 526/230" should read
   --5,021,487 6/1991 Klemarczuk 526/230--.

Column 20 Line 33 "va-ied" should read --varied--.

Signed and Sealed this

Twenty-sixth Day of October, 1993

*Attest:*

BRUCE LEHMAN

*Attesting Officer*    *Commissioner of Patents and Trademarks*